(12) United States Patent
Honda

(10) Patent No.: US 11,139,231 B2
(45) Date of Patent: Oct. 5, 2021

(54) RADIO FREQUENCY MODULE AND COMMUNICATION DEVICE

(71) Applicant: Murata Manufacturing Co., Ltd., Kyoto (JP)

(72) Inventor: Akifumi Honda, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 82 days.

(21) Appl. No.: 16/591,727

(22) Filed: Oct. 3, 2019

(65) Prior Publication Data

US 2020/0035592 A1 Jan. 30, 2020

Related U.S. Application Data

(63) Continuation of application No. PCT/JP2018/010638, filed on Mar. 16, 2018.

(30) Foreign Application Priority Data

Apr. 4, 2017 (JP) .............................. JP2017-074463

(51) Int. Cl.
| | | |
|---|---|---|
| *H01L 23/498* | (2006.01) | |
| *H01L 23/66* | (2006.01) | |
| *H05K 1/02* | (2006.01) | |

(52) U.S. Cl.
CPC .. *H01L 23/49833* (2013.01); *H01L 23/49822* (2013.01); *H01L 23/49838* (2013.01);
(Continued)

(58) Field of Classification Search
CPC ......... H01L 23/49833; H01L 23/49822; H01L 23/49838; H01L 23/66; H01L 2224/32225;
(Continued)

(56) References Cited

U.S. PATENT DOCUMENTS

2005/0272399 A1* 12/2005 Murata ..................... H03B 5/36
455/333
2007/0075767 A1* 4/2007 Abe ......................... H05K 1/0265
330/66
(Continued)

FOREIGN PATENT DOCUMENTS

| JP | 2005-210044 A | 8/2005 |
|---|---|---|
| JP | 2008-258369 A | 10/2008 |

(Continued)

OTHER PUBLICATIONS

International Search Report for International Application No. PCT/JP2018/010638, dated May 22, 2018.
(Continued)

*Primary Examiner* — Karen Kusumakar
*Assistant Examiner* — Adam S Bowen
(74) *Attorney, Agent, or Firm* — Pearne & Gordon LLP

(57) ABSTRACT

A radio frequency module includes: a multilayer substrate that includes a plurality of insulator layers; an amplifying circuit that is provided on the multilayer substrate and amplifies a radio frequency signal; a power supply circuit that is provided on the multilayer substrate and supplies power to the amplifying circuit; a ground conductor that is a first conductor pattern having a ground potential and used in the amplifying circuit; and a ground conductor that is a second conductor pattern having a ground potential and used in the power supply circuit. The ground conductors are physically separated from each other and provided in internal layers of the multilayer substrate.

11 Claims, 6 Drawing Sheets

(52) U.S. Cl.
CPC ........... *H01L 23/66* (2013.01); *H05K 1/0298* (2013.01); *H01L 2224/32225* (2013.01); *H05K 2201/062* (2013.01)

(58) Field of Classification Search
CPC ............ H01L 2223/6655; H01L 23/50; H05K 1/0298; H05K 2201/062; H03F 3/189
See application file for complete search history.

(56) References Cited

U.S. PATENT DOCUMENTS

| | | | | |
|---|---|---|---|---|
| 2008/0261005 | A1* | 10/2008 | Nomiya | H01L 23/15 428/210 |
| 2010/0224396 | A1* | 9/2010 | Nomiya | B32B 9/005 174/258 |
| 2011/0281540 | A1* | 11/2011 | Furutani | H04B 1/48 455/269 |
| 2012/0098598 | A1* | 4/2012 | Uno | H03F 1/32 330/277 |
| 2013/0257565 | A1* | 10/2013 | Masuda | H01L 25/162 333/247 |
| 2014/0132365 | A1* | 5/2014 | Nakamura | H03H 11/348 333/133 |
| 2014/0133117 | A1* | 5/2014 | Saji | H01L 24/24 361/761 |
| 2014/0202750 | A1* | 7/2014 | Kogure | H05K 1/165 174/260 |
| 2014/0268586 | A1* | 9/2014 | Hoshi | H01L 23/50 361/728 |
| 2014/0342683 | A1* | 11/2014 | Takikawa | H03F 3/19 455/232.1 |
| 2015/0200660 | A1* | 7/2015 | Masuda | H03K 17/16 327/379 |
| 2016/0037640 | A1* | 2/2016 | Takai | H01L 23/3107 361/753 |
| 2016/0057862 | A1* | 2/2016 | Kitajima | H05K 3/4611 455/550.1 |

FOREIGN PATENT DOCUMENTS

| | | |
|---|---|---|
| JP | 2011-003651 A | 1/2011 |
| JP | 2014-139962 A | 7/2014 |
| JP | 2016-171220 A | 9/2016 |
| JP | 2016171220 A * | 9/2016 |
| WO | 2010-087302 A1 | 8/2010 |

OTHER PUBLICATIONS

Written Opinion for International Application No. PCT/JP2018/010638, dated May 22, 2018.

* cited by examiner

RADIO FREQUENCY MODULE AND COMMUNICATION DEVICE

This is a continuation of International Application No. PCT/JP2018/010638 filed on Mar. 16, 2018 which claims priority from Japanese Patent Application No. 2017-074463 filed on Apr. 4, 2017. The contents of these applications are incorporated herein by reference in their entireties.

BACKGROUND

Technical Field

The present disclosure relates to a radio frequency module and a communication device and specifically relates to a radio frequency module including an amplifying circuit provided on a multilayer substrate and ground conductors in the multilayer substrate.

Currently, a radio frequency module including an amplifying circuit provided on a multilayer substrate and ground conductors in the multilayer substrate is available. For example, Patent Document 1 discloses a power amplifier module that is an example of such a radio frequency module.

FIG. 11 is a circuit diagram illustrating the configuration of a power amplifier module 900 described in Patent Document 1. The power amplifier module 900 includes a semiconductor circuit unit Q1 formed by connecting semiconductor elements in three stages, an input matching circuit unit IM1 that is connected upstream of the semiconductor circuit unit Q1, an output matching circuit unit OM1 that is connected downstream of the semiconductor circuit unit Q1, and a bias circuit unit BC1.

Patent Document 1 states that, ideally, the impedance of inductor elements L5 to L8 of the bias circuit unit BC1 is required to be made infinite so as to prevent leakage of a signal amplified by the semiconductor circuit unit Q1 to a power terminal Vdd.

Patent Document 1: Japanese Unexamined Patent Application Publication No. 2005-210044

BRIEF SUMMARY

In a radio frequency module provided in a multilayer substrate, it is a common practice to form a conductor pattern having a ground potential on the multilayer substrate or in the multilayer substrate in a relatively large area. Such a conductor pattern is also called a ground pattern or a ground conductor and is used to ground a circuit, shield noise, dissipate heat, etc. For example, in the power amplifier module 900 of Patent Document 1, a ground pattern that occupies substantially the whole area of an internal layer of the multilayer substrate is formed in the internal layer.

With the configuration of the power amplifier module 900, however, it is possible to prevent leakage of a signal amplified by the semiconductor circuit unit Q1 to the power terminal Vdd but it might not be possible to fully prevent leakage of the signal to the bias circuit unit BC1. If leakage of a signal from the amplifying circuit to the bias circuit is not fully prevented, feedback of the leaking signal to the amplifying circuit from the bias circuit may cause troubles, such as degradation in the characteristics of the amplifying circuit or oscillation, which are concerns.

Accordingly, the present disclosure provides a radio frequency module that can prevent leakage of a signal from an amplifying circuit to a bias circuit, and more extensively, can prevent leakage of a signal from an amplifying circuit to a power supply circuit with a higher degree of certainty.

Solution to Problem

A radio frequency module according to an aspect of the present disclosure includes: a multilayer substrate that includes a plurality of insulator layers; an amplifying circuit that is provided on the multilayer substrate and amplifies a radio frequency signal; a power supply circuit that is provided on the multilayer substrate and supplies power to the amplifying circuit; a first conductor pattern that has a ground potential and is used in the amplifying circuit; and a second conductor pattern that has a ground potential and is used in the power supply circuit. The first conductor pattern and the second conductor pattern are physically separated from each other and provided in internal layers of the multilayer substrate.

In this configuration, the first conductor pattern for the amplifying circuit and the second conductor pattern for the power supply circuit physically separated from each other in internal layers of the multilayer substrate are provided. Accordingly, leakage of a signal between the amplifying circuit and the power supply circuit through the conductor patterns is prevented with a higher degree of certainty than in a case where one conductor pattern is provided without necessarily separating the conductor pattern into a conductor pattern for the amplifying circuit and a conductor pattern for the power supply circuit. As a result, degradation in the amplification characteristics or oscillation caused by a signal leaking to the power supply circuit and fed back to the amplifying circuit can be avoided, and a radio frequency module having higher performance can be obtained.

The first and second conductor patterns separated from each other in internal layers of the multilayer substrate may each be extended to an outermost layer of the multilayer substrate through, for example, a via conductor and may be connected to each other in the outermost layer. In this case, a ground potential can be applied to the first and second conductor patterns from the connecting point in the outermost layer. A signal leaking between the amplifying circuit and the power supply circuit through the first and second conductor patterns passes through a long signal path via the outermost layer and attenuates to a large degree, and therefore, the effect of preventing leakage of a signal is maintained.

Further, the first conductor pattern and the second conductor pattern may be provided in a same internal layer of the multilayer substrate.

In this configuration, the first and second conductor patterns can be provided by using one internal layer, and therefore, the height of the radio frequency module can be reduced.

Further, the amplifying circuit may include an amplifying element, an input matching circuit that is connected to an input end of the amplifying element, and an output matching circuit that is connected to an output end of the amplifying element, and the first conductor pattern may be physically separated into a first portion that has a ground potential and is used in the input matching circuit and a second portion that has a ground potential and is used in the output matching circuit.

In this configuration, the first conductor pattern is separated into the first and second portions, and therefore, signals are less likely to leak between the input matching circuit and the power supply circuit and between the output matching circuit and the power supply circuit, and a more significant feedback suppression effect can be attained.

Further, the amplifying circuit may include a first amplifying element and a second amplifying element, the power supply circuit may include a first power supply circuit that is connected to the first amplifying element and a second power supply circuit that is connected to the second amplifying element, and the second conductor pattern may be physically separated into a third portion that has a ground potential and is used in the first power supply circuit and a fourth portion that has a ground potential and is used in the second power supply circuit.

In this configuration, the second conductor pattern is separated into the third and fourth portions, and therefore, signals are less likely to leak between the amplifying circuit and the first and second power supply circuits, and a more significant feedback suppression effect can be attained.

Further, in a peripheral portion of at least one conductor pattern among the first conductor pattern and the second conductor pattern, a plurality of via conductors that are electrically connected to the at least one conductor pattern and extend in a laminating direction (a direction perpendicular to main surfaces of the multilayer substrates) of the multilayer substrate may be provided.

In this configuration, the plurality of via conductors function as shields, and therefore, a signal is less likely to leak between the amplifying circuit and the power supply circuit, and a more significant feedback suppression effect can be attained.

A communication device according to an aspect of the present disclosure includes: the radio frequency module; and an RF signal processing circuit that is connected to the radio frequency module.

In this configuration, the radio frequency module that can prevent leakage of a signal from the amplifying circuit to the power supply circuit with a higher degree of certainty is used, and therefore, a high-performance communication device can be obtained.

In the radio frequency module according to the present disclosure, the first conductor pattern having a ground potential and used in the amplifying circuit and the second conductor pattern having a ground potential and used in the power supply circuit are physically separated from each other and provided in internal layers of the multilayer substrate. Accordingly, a radio frequency module that can prevent leakage of a signal from the amplifying circuit to the power supply circuit with a higher degree of certainty can be obtained. When such a radio frequency module is used in a communication device, a communication device having high performance can be obtained.

DETAILED DESCRIPTION

Figure 1:
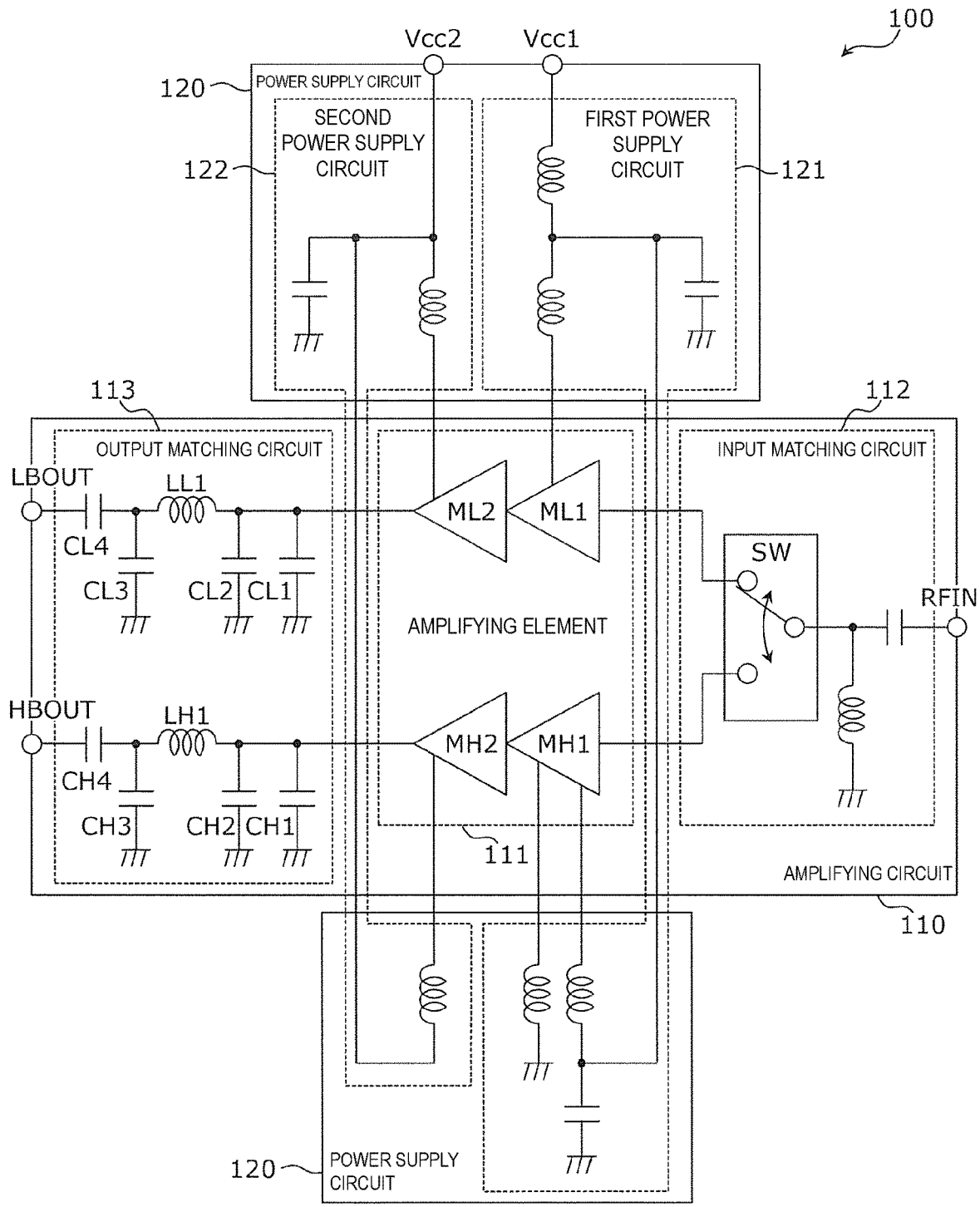
FIG. 1 is a circuit diagram illustrating an example functional configuration of a radio frequency module according to a first embodiment.

Hereinafter, embodiments of the present disclosure will be described in detail with reference to the drawings. Note that all embodiments described below illustrate general or specific examples. Numerical values, forms, materials, constituent elements, the arrangements and connections of constituent elements, and so on indicated in the following embodiments are examples and are not intended to limit the present disclosure. Among the constituent elements described in the following embodiments, constituent elements not stated in the independent claims will be described as optional constituent elements. The dimensions or dimensional ratios of the constituent elements illustrated in the drawings are not necessarily accurate.

First Embodiment

A radio frequency module according to a first embodiment is a multiband amplifier module provided in a multilayer substrate. The functional configuration of the radio frequency module will be described first, and the structural features of the radio frequency module will be described subsequently.

FIG. 1 is a circuit diagram illustrating an example functional configuration of the radio frequency module according to the first embodiment. As illustrated in FIG. 1, a radio frequency module 100 includes an amplifying circuit 110 that amplifies a radio frequency signal and a power supply circuit 120 that supplies power to the amplifying circuit 110.

The amplifying circuit 110 is a multiband amplifying circuit, receives a multiband input radio frequency signal RFIN including radio frequency signals in two frequency bands, and outputs output radio frequency signals LBOUT and HBOUT in the respective frequency bands obtained by amplifying the input radio frequency signal RFIN.

The amplifying circuit 110 includes an amplifying element 111, an input matching circuit 112 connected to an input end of the amplifying element 111, and an output matching circuit 113 connected to an output end of the amplifying element 111. The amplifying element 111 has two signal paths corresponding to different frequency bands and includes amplifying elements in two stages for each of the signal paths. Amplifying elements ML1 and MH1 in the preceding stage correspond to an example of a first amplifying element, and amplifying elements ML2 and MH2 in the subsequent stage correspond to an example of a second amplifying element. As a non-limiting example, the amplifying elements ML1, MH1, ML2, and MH2 may be hetero bipolar transistors. The amplifying element 111 may be formed of an integrated circuit (IC) including the amplifying elements ML1, MH1, ML2, and MH2.

The input matching circuit 112 performs impedance matching on the input radio frequency signal RFIN and supplies the input radio frequency signal RFIN to one of the signal paths of the amplifying element 111 selected by a switch SW. The amplifying element 111 amplifies the radio frequency signal supplied from the input matching circuit 112 and supplies the radio frequency signal to the output matching circuit 113. The output matching circuit 113 performs impedance matching on the radio frequency signal supplied from the amplifying element 111 and outputs the radio frequency signal as the output radio frequency signal LBOUT or HBOUT. The output radio frequency signals LBOUT and HBOUT are supplied to a circuit in a subsequent stage not illustrated. Both the input matching circuit 112 and the output matching circuit 113 are general impedance matching circuits, and therefore, detailed descriptions thereof will be omitted.

The power supply circuit 120 includes a first power supply circuit 121 and a second power supply circuit 122.

The first power supply circuit 121 is connected to the amplifying elements ML1 and MH1 in the preceding stage included in the amplifying element 111 and supplies a bias voltage Vcc1 to the amplifying elements ML1 and MH1. The second power supply circuit 122 is connected to the amplifying elements ML2 and MH2 in the subsequent stage included in the amplifying element 111 and supplies a bias voltage Vcc2 to the amplifying elements ML2 and MH2. That is, the first power supply circuit 121 and the second power supply circuit 122, each includes a bias circuit that supplies a bias voltage to the amplifying element 111. The bias voltages Vcc1 and Vcc2 are generated by, for example, a power supply module (not illustrated) provided separately from the radio frequency module 100, and are supplied to the radio frequency module 100.

Now, the structure of the radio frequency module 100 will be described.

Figure 2:
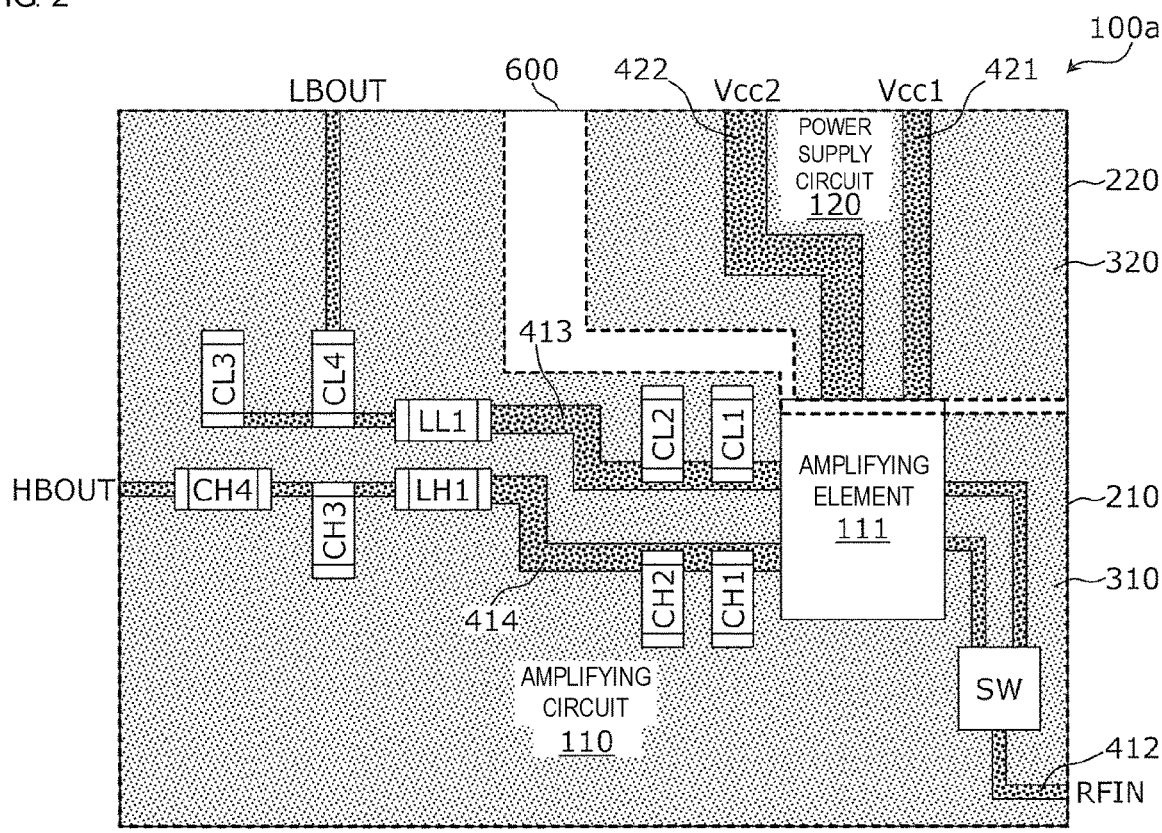
FIG. 2 is a schematic diagram illustrating an example planar structure of the radio frequency module according to the first embodiment viewed from a direction perpendicular to a main surface of a multilayer substrate.
Figure 3:
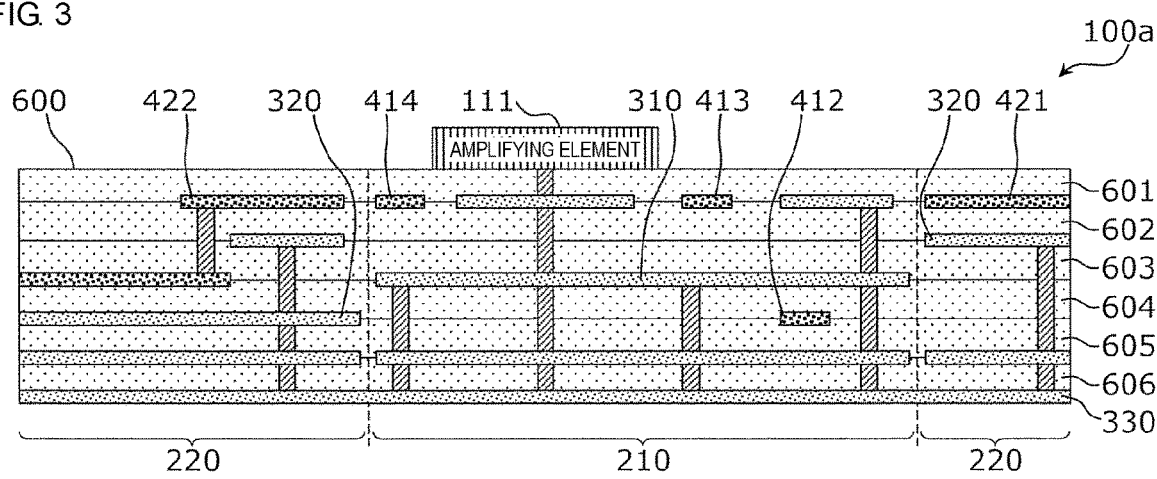
FIG. 3 is a schematic diagram illustrating a cross sectional view of an example layered structure of the radio frequency module according to the first embodiment viewed from a direction parallel to the main surface of the multilayer substrate.

FIG. 2 and FIG. 3 are schematic diagrams respectively illustrating an example planar structure and an example layered structure of the radio frequency module according to the first embodiment. FIG. 2 illustrates a rough planar arrangement of main circuit elements illustrated in FIG. 1 with reference numerals the same as those in FIG. 1.

A radio frequency module 100a illustrated in FIG. 2 and FIG. 3 is formed by using a multilayer substrate 600. The multilayer substrate 600 is formed by laminating a plurality of insulator layers 601 to 606. On the multilayer substrate 600, the amplifying circuit 110 and the power supply circuit 120 are provided. The amplifying circuit 110 and the power supply circuit 120 may be, for example, respectively provided in regions 210 and 220 that do not overlap in plan view of the multilayer substrate 600.

In the multilayer substrate 600, a plurality of conductor patterns are provided. The conductor patterns are conductors provided along the main surfaces of the insulator layers 601 to 606. The conductor patterns include wiring conductors that transmit signals and power and ground conductors that have a ground potential and are used to ground circuits, shield noise, dissipate heat, etc. The conductor patterns provided in different layers are connected to each other as appropriate by a conductor via that penetrates through some of the insulator layers 601 to 606 and extends in the laminating direction (a direction perpendicular to the main surfaces of the insulator layers 601 to 606).

In the examples illustrated in FIG. 2 and FIG. 3, a ground conductor 310 and wiring conductors 412, 413, and 414 are provided in the region 210 in which the amplifying circuit 110 is provided. The ground conductor 310 is used in the amplifying circuit 110. The use of the ground conductor 310 in the amplifying circuit 110 may mean that, for example, the ground conductor 310 is connected to an element that constitutes the amplifying circuit 110. The wiring conductor 412 transmits the input radio frequency signal RFIN. The wiring conductors 413 and 414 respectively transmit the output radio frequency signals LBOUT and HBOUT. Here, the ground conductor 310 is an example of a first conductor pattern.

In the region 220 in which the power supply circuit 120 is provided, a ground conductor 320 and wiring conductors 421 and 422 are provided. The ground conductor 320 is used in the power supply circuit 120. The use of the ground conductor 320 in the power supply circuit 120 may mean that, for example, the ground conductor 320 is connected to an element that constitutes the power supply circuit 120. The wiring conductors 421 and 422 respectively transmit the bias voltages Vcc1 and Vcc2. Here, the ground conductor 320 is an example of a second conductor pattern.

In FIG. 3, although only the ground conductors 310 and 320, which are representative ground conductors, are assigned the reference numerals, the ground conductors 310 and 320 are not limited to the conductor patterns with which the reference numerals are assigned. Any conductor pattern, that is in an internal layer of the multilayer substrate 600, has a ground potential, and is used in the amplifying circuit 110, is included in the ground conductor 310. Any conductor pattern, that is in an internal layer of the multilayer substrate 600, has a ground potential, and is used in the power supply circuit 120, is included in the ground conductor 320.

In the radio frequency module 100a, the ground conductors 310 and 320 are physically separated from each other and are provided in internal layers of the multilayer substrate 600.

Elements CL1, CL2, CL3, CH1, CH2, and CH3 that constitute the amplifying circuit 110 are each connected to the ground conductor 310 by a conductor via interposed therebetween. An element (not illustrated) that constitutes the power supply circuit 120 is connected to the ground conductor 320 by another conductor via interposed therebetween. That is, the ground conductor 310 used in the amplifying circuit 110 and the ground conductor 320 used in the power supply circuit 120 are physically separated from each other in internal layers of the multilayer substrate 600. Accordingly, leakage of an output signal from the amplifying circuit 110 to the power supply circuit 120 through the ground conductors is prevented with a higher degree of certainty than in a case where one ground conductor is provided without necessarily separating the ground conductor into a ground conductor for the amplifying circuit 110 and a ground conductor for the power supply circuit 120.

A ground conductor used in the amplifying circuit 110 need not be connected to an element constituting the amplifying circuit 110. For example, even if a ground conductor that is provided in order to shield noise in the amplifying circuit 110 is not connected to an element constituting the amplifying circuit 110, the ground conductor is an example of a ground conductor used in the amplifying circuit 110. Similarly, a ground conductor used in the power supply circuit 120 need not be connected to an element constituting the power supply circuit 120.

The ground conductors 310 and 320 may each be extended to an outermost layer (the lower surface in the example in FIG. 3) of the multilayer substrate 600 through a via conductor and may be connected to each other by a conductor pattern 330 provided on the outermost layer. Accordingly, a ground potential can be applied to the ground conductors 310 and 320 from the conductor pattern 330. A signal leaking between the amplifying circuit 110 and the power supply circuit 120 through the conductor pattern 330 passes through a long signal path via the outermost layer and attenuates to a large degree, and therefore, the effect of preventing leakage of a signal is maintained.

Accordingly, leakage of a signal from the amplifying circuit 110 to the power supply circuit 120 is prevented with a higher degree of certainty. As a result, degradation in the amplification characteristics or oscillation caused by a signal leaking from the amplifying circuit 110 to the power supply circuit 120 and fed back to the amplifying circuit 110 can be avoided, and the radio frequency module 100*a* having higher performance can be obtained.

The ground conductors 310 and 320 may be provided in the same internal layer of the multilayer substrate 600. In FIG. 3, for example, ground conductors are provided in the respective regions 210 and 220 in a bonding surface between the insulator layers 605 and 606.

The ground conductors 310 and 320 provided in the same internal layer of the multilayer substrate 600 may mean that at least a portion of the ground conductor 310 and at least a portion of the ground conductor 320 are at the same height in the laminating direction of the multilayer substrate 600. In other words, the ground conductor 310 and the ground conductor 320 may have respective portions that overlap in side view of the multilayer substrate 600.

Accordingly, the ground conductors 310 and 320 can be provided in one internal layer, and therefore, the height of the radio frequency module can be reduced.

Second Embodiment

A radio frequency module according to a second embodiment differs from the radio frequency module according to the first embodiment in that the radio frequency module according to the second embodiment includes via conductors that are provided in a peripheral portion of each of the ground conductors and that are electrically connected to the ground conductor. A description of a matter similar to that in the first embodiment will be omitted below, and a different matter in the second embodiment will be mainly described.

Figure 4:
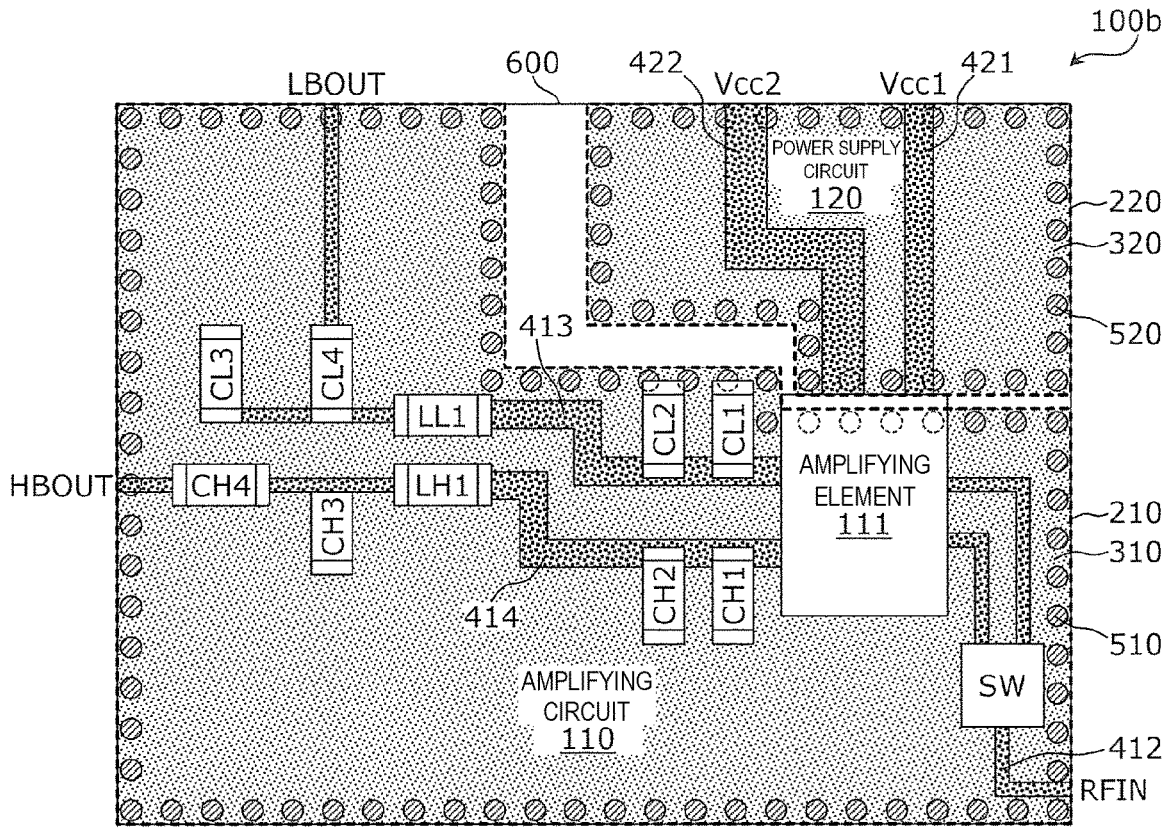
FIG. 4 is a schematic diagram illustrating an example planar structure of a radio frequency module according to a second embodiment viewed from a direction perpendicular to a main surface of a multilayer substrate.
Figure 5:
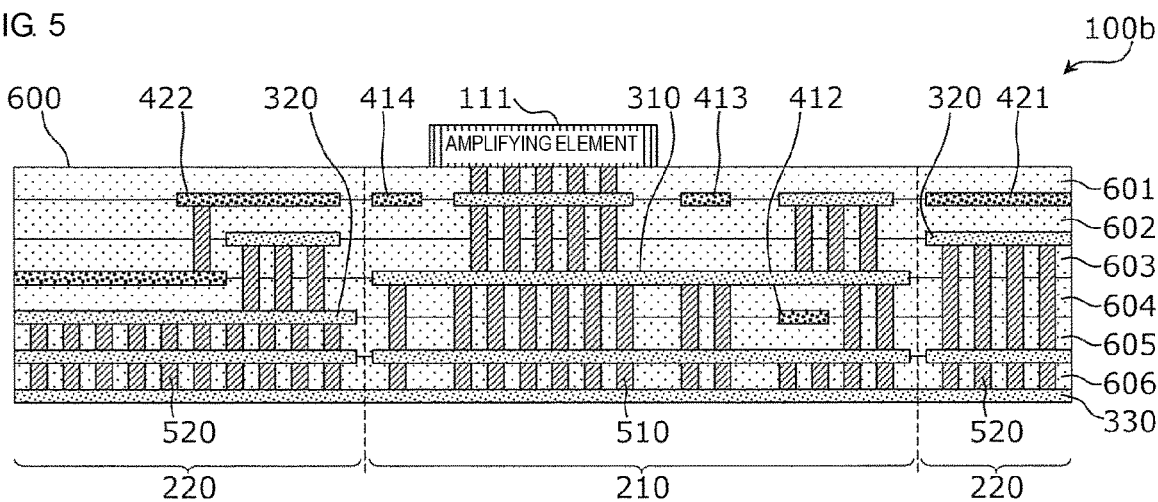
FIG. 5 is a schematic diagram illustrating a cross sectional view of an example layered structure of the radio frequency module according to the second embodiment viewed from a direction parallel to the main surface of the multilayer substrate.

FIG. 4 and FIG. 5 are schematic diagrams respectively illustrating an example planar structure and an example layered structure of a radio frequency module 100*b* according to the second embodiment. Unlike in the radio frequency module 100*a* illustrated in FIG. 2 and FIG. 3, in the radio frequency module 100*b*, a plurality of via conductors 510 and a plurality of via conductors 520 are respectively added to a peripheral portion of the ground conductor 310 and a peripheral portion of the ground conductor 320. The via conductors 510 and the via conductors 520 are electrically connected to the peripheral portion of the ground conductor 310 and the peripheral portion of the ground conductor 320 respectively to thereby have a ground potential.

In the radio frequency module 100*b*, the plurality of via conductors 510 and the plurality of via conductors 520 function as shields. Accordingly, a signal is less likely to leak between the amplifying circuit 110 and the power supply circuit 120, and a more significant feedback suppression effect can be attained.

Third Embodiment

A radio frequency module according to a third embodiment differs from the radio frequency module according to the first embodiment in that the ground conductors are separated into smaller portions and provided. A description of a matter similar to that in the first embodiment will be omitted below, and a different matter in the third embodiment will be mainly described.

Figure 6:
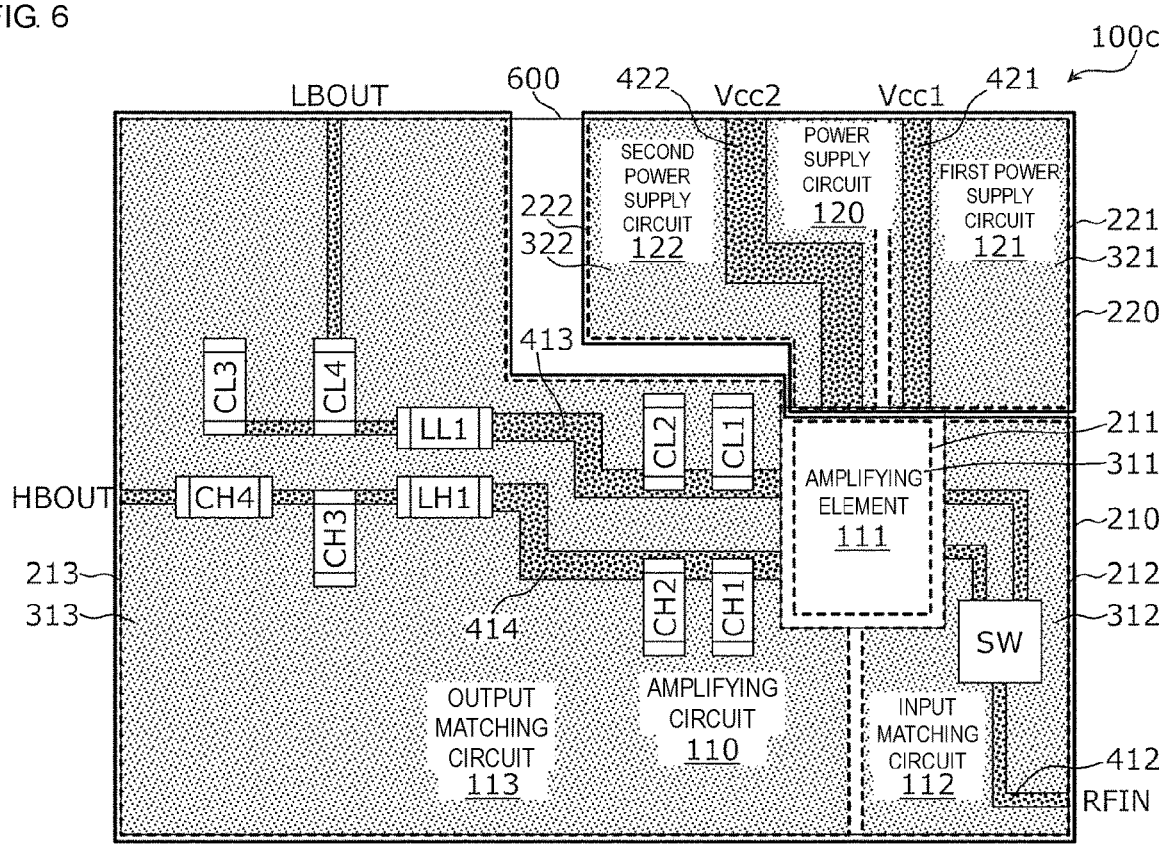
FIG. 6 is a schematic diagram illustrating an example planar structure of a radio frequency module according to a third embodiment viewed from a direction perpendicular to a main surface of a multilayer substrate.
Figure 7:
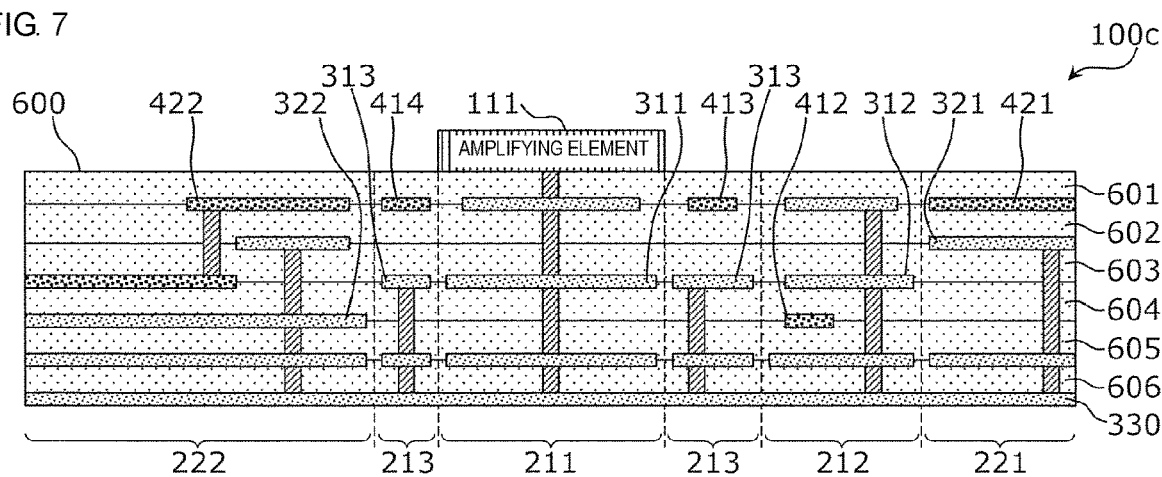
FIG. 7 is a schematic diagram illustrating a cross sectional view of an example layered structure of the radio frequency module according to the third embodiment viewed from a direction parallel to the main surface of the multilayer substrate.

FIG. 6 and FIG. 7 are schematic diagrams respectively illustrating an example planar structure and an example layered structure of a radio frequency module 100*c* according to the third embodiment. In the radio frequency module 100*c*, each of the regions 210 and 220 is further divided into a plurality of small portions.

The region 210 is divided into portions 211, 212, and 213 that do not overlap in plan view of the multilayer substrate 600. The amplifying element 111, the input matching circuit 112, and the output matching circuit 113 may be provided, for example, in each of the portions 211, 212, and 213 of the region 210.

The region 220 is divided into portions 221 and 222 that do not overlap in plan view of the multilayer substrate 600. The first power supply circuit 121 and the second power supply circuit 122 may be provided, for example, in each of the portions 221 and 222 of the region 220.

In the examples illustrated in FIG. 6 and FIG. 7, in the portion 211 in which the amplifying element 111 is provided, a ground conductor 311 is provided. In the portion 212 in which the input matching circuit 112 is provided, a ground conductor 312 and the wiring conductor 412 are provided. In the portion 213 in which the output matching circuit 113 is provided, a ground conductor 313 and the wiring conductors 413 and 414 are provided. That is, in the radio frequency module 100*c*, the ground conductor 310, which is the first conductor pattern, is physically separated into the ground conductors 311, 312, and 313.

The ground conductors 311, 312, and 313 are respectively used in the amplifying element 111, the input matching circuit 112, and the output matching circuit 113. The use of the ground conductor 311 in the amplifying element 111 may mean that, for example, the ground conductor 311 is connected to the amplifying element 111. The use of the ground conductor 312 in the input matching circuit 112 may mean that, for example, the ground conductor 312 is connected to an element constituting the input matching circuit 112. The use of the ground conductor 313 in the output matching circuit 113 may mean that, for example, the ground conductor 313 is connected to an element constituting the output matching circuit 113. Here, the ground conductor 312 is an example of a first portion of the first conductor pattern, and the ground conductor 313 is an example of a second portion of the first conductor pattern.

In the portion 221 in which the first power supply circuit 121 is provided, a ground conductor 321 and the wiring conductor 421 are provided. In the portion 222 in which the second power supply circuit 122 is provided, a ground conductor 322 and the wiring conductor 422 are provided. That is, in the radio frequency module 100c, the ground conductor 320, which is the second conductor pattern, is physically separated into the ground conductors 321 and 322.

The ground conductors 321 and 322 are respectively used in the first power supply circuit 121 and the second power supply circuit 122. The use of the ground conductor 321 in the first power supply circuit 121 may mean that, for example, the ground conductor 321 is connected to an element constituting the first power supply circuit 121. The use of the ground conductor 322 in the second power supply circuit 122 may mean that, for example, the ground conductor 322 is connected to an element constituting the second power supply circuit 122. Here, the ground conductor 321 is an example of a third portion of the second conductor pattern, and the ground conductor 322 is an example of a fourth portion of the second conductor pattern.

In the radio frequency module 100c, the ground conductors 311, 312, 313, 321, and 322 are physically separated from each other and provided in internal layers of the multilayer substrate 600.

The amplifying element 111 is connected to the ground conductor 311 by a conductor via interposed therebetween. An element (not illustrated) that constitutes the input matching circuit 112 is connected to the ground conductor 312 by another conductor via interposed therebetween. The elements CL1, CL2, CL3, CH1, CH2, and CH3 that constitute the output matching circuit 113 are each connected to the ground conductor 313 by yet another conductor via interposed therebetween.

An element (not illustrated) that constitutes the first power supply circuit 121 is connected to the ground conductor 321 by a conductor via interposed therebetween. An element (not illustrated) that constitutes the second power supply circuit 122 is connected to the ground conductor 322 by another conductor via interposed therebetween.

That is, the ground conductor 311 used in the amplifying element 111, the ground conductor 312 used in the input matching circuit 112, the ground conductor 313 used in the output matching circuit 113, the ground conductor 321 used in the first power supply circuit 121, and the ground conductor 322 used in the second power supply circuit 122 are physically separated from each other in internal layers of the multilayer substrate 600.

Accordingly, leakage of an output signal from the amplifying circuit 110 to the power supply circuit 120 through the ground conductors is prevented with a higher degree of certainty than in a case where one ground conductor is provided without necessarily separating the ground conductor into a ground conductor for at least one circuit among the amplifying element 111, the input matching circuit 112, and the output matching circuit 113 and a ground conductor for at least one circuit among the first power supply circuit 121 and the second power supply circuit 122.

Unlike the radio frequency module 100a illustrated in FIG. 2 and FIG. 3, the ground conductors are separated into smaller portions. Accordingly, signals are less likely to leak among the amplifying element 111, the input matching circuit 112, the output matching circuit 113, the first power supply circuit 121, and the second power supply circuit 122, and a more significant feedback suppression effect can be attained.

The ground conductor 311 used in the amplifying element 111 need not be connected to the amplifying element 111. For example, even if a ground conductor that is provided in order to shield noise or dissipate heat in the amplifying element 111 is not connected to the amplifying element 111, the ground conductor is an example of a ground conductor used in the amplifying element 111. Similarly, a ground conductor used in the input matching circuit 112 need not be connected to an element constituting the input matching circuit 112, and a ground conductor used in the output matching circuit 113 need not be connected to an element constituting the output matching circuit 113. Further, a ground conductor used in the first power supply circuit 121 need not be connected to an element constituting the first power supply circuit 121, and a ground conductor used in the second power supply circuit 122 need not be connected to an element constituting the second power supply circuit 122.

Fourth Embodiment

A radio frequency module according to a fourth embodiment differs from the radio frequency module according to the third embodiment in that the radio frequency module according to the fourth embodiment includes via conductors that are provided in a peripheral portion of each of the ground conductors and that are electrically connected to the ground conductor. A description of a matter similar to that in the third embodiment will be omitted below, and a different matter in the fourth embodiment will be mainly described.

Figure 8:
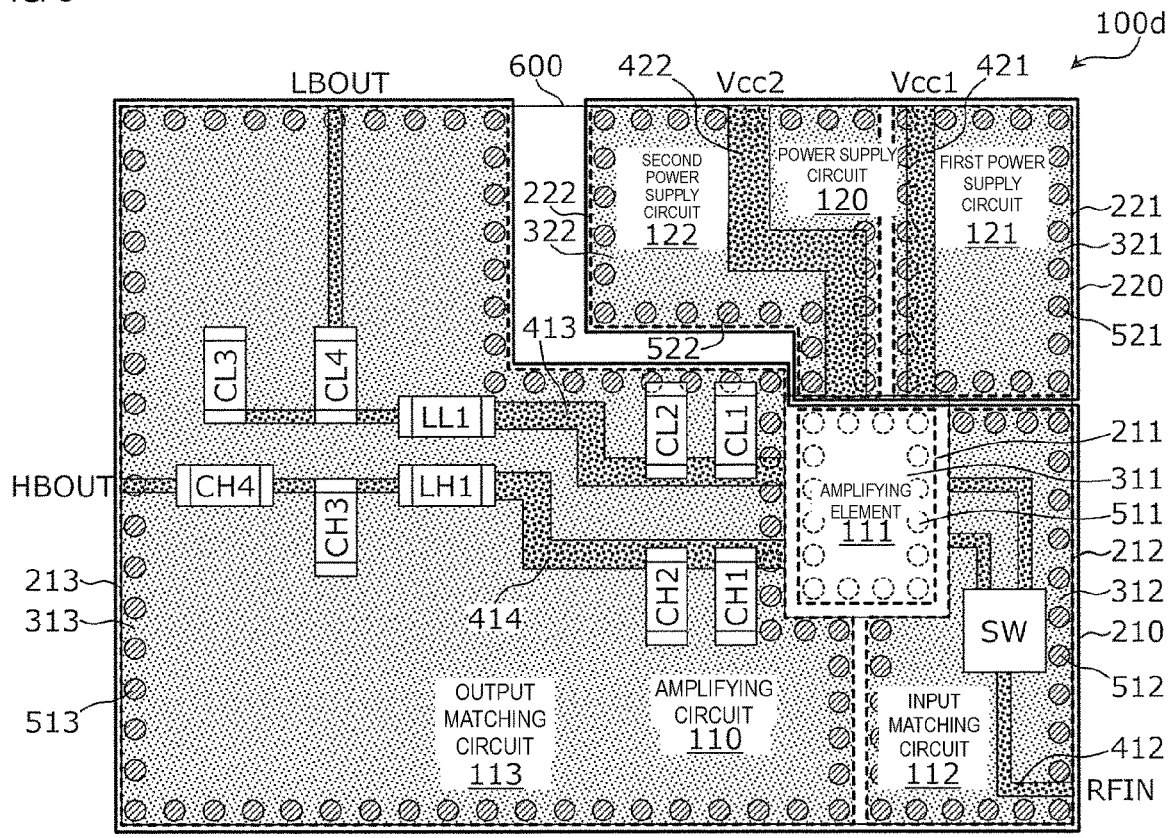
FIG. 8 is a schematic diagram illustrating an example planar structure of a radio frequency module according to a fourth embodiment viewed from a direction perpendicular to a main surface of a multilayer substrate.
Figure 9:
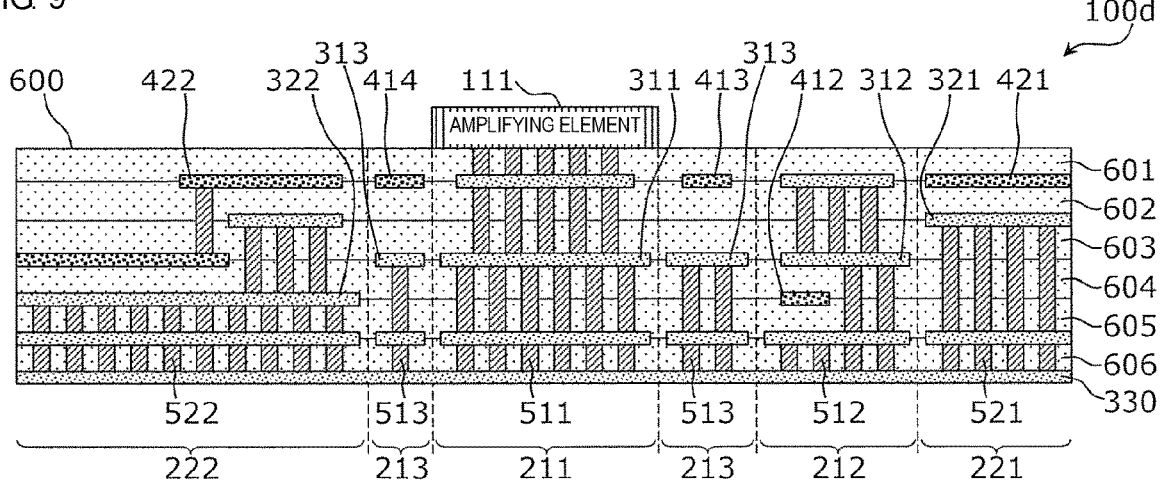
FIG. 9 is a schematic diagram illustrating a cross sectional view of an example layered structure of the radio frequency module according to the fourth embodiment viewed from a direction parallel to the main surface of the multilayer substrate.

FIG. 8 and FIG. 9 are schematic diagrams respectively illustrating an example planar structure and an example layered structure of a radio frequency module 100d according to the fourth embodiment. Unlike in the radio frequency module 100c illustrated in FIG. 6 and FIG. 7, in the radio frequency module 100d, a plurality of via conductors 511, a plurality of via conductors 512, a plurality of via conductors 513, a plurality of via conductors 521, and a plurality of via conductors 522 are respectively added to a peripheral portion of the ground conductor 311, that of the ground conductor 312, that of the ground conductor 313, that of the ground conductor 321, and that of the ground conductor 322. The via conductors 511, the via conductors 512, the via conductors 513, the via conductors 521, and the via conductors 522 are electrically connected to the peripheral portion of the ground conductor 311, that of the ground conductor 312, that of the ground conductor 313, that of the ground conductor 321, and that of the ground conductor 322 respectively to thereby have a ground potential.

In the radio frequency module 100d, the plurality of via conductors 511, the plurality of via conductors 512, the plurality of via conductors 513, the plurality of via conductors 521, and the plurality of via conductors 522 function as shields. Accordingly, signals are less likely to leak among the amplifying element 111, the input matching circuit 112, the output matching circuit 113, the first power supply circuit 121, and the second power supply circuit 122, and a more significant feedback suppression effect can be attained.

Fifth Embodiment

In a fifth embodiment, a communication device including any of the radio frequency modules described in the first to fourth embodiments will be described.

Figure 10:
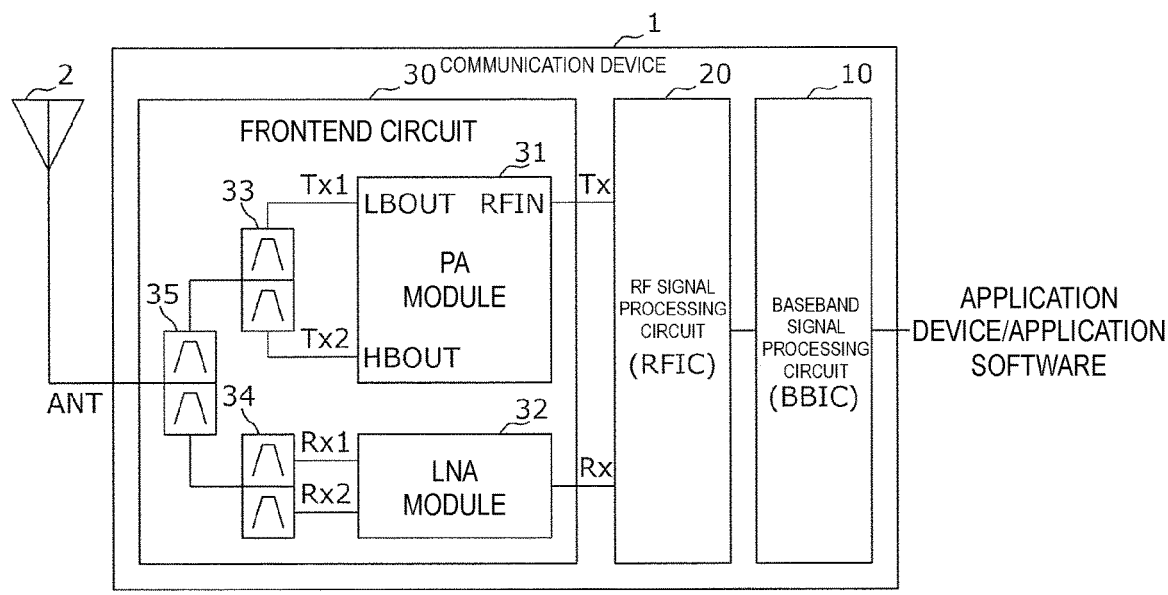
FIG. 10 is a block diagram illustrating an example functional configuration of a communication device according to a fifth embodiment.
Figure 11:
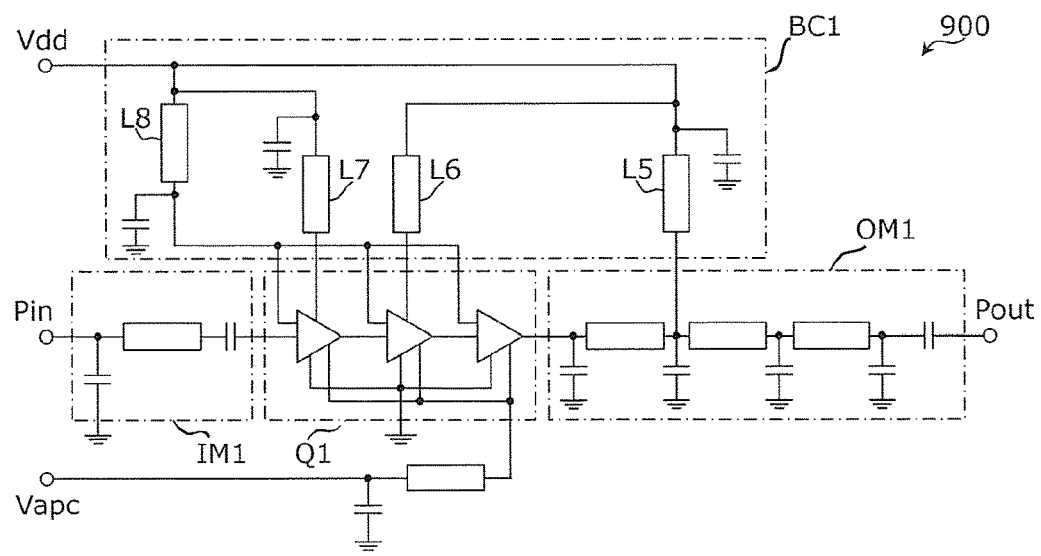
FIG. 11 is a circuit diagram illustrating an example configuration of an existing power amplifier module.

FIG. 10 is a block diagram illustrating an example functional configuration of a communication device 1 according to the fifth embodiment. As illustrated in FIG. 10, the communication device 1 includes a baseband signal processing circuit 10, an RF signal processing circuit 20, and a frontend circuit 30.

The baseband signal processing circuit 10 converts transmission data generated by an application device or application software for voice calls, image display, etc. to a transmission signal and supplies the transmission signal to the RF signal processing circuit 20. This conversion may include data compression, multiplexing, and error correcting code addition. The baseband signal processing circuit 10 converts a reception signal received from the RF signal processing circuit 20 to reception data and supplies the reception data to an application device or application software. This conversion may include data decompression, demultiplexing, and error correction. The baseband signal processing circuit 10 may be formed of a baseband integrated circuit (BBIC).

The RF signal processing circuit 20 converts a transmission signal received from the baseband signal processing circuit 10 to a transmission RF signal Tx and supplies the transmission RF signal Tx to the frontend circuit 30. This conversion may include signal modulation and up-conversion. The RF signal processing circuit 20 converts a reception RF signal Rx received from the frontend circuit 30 to a reception signal and supplies the reception signal to the baseband signal processing circuit 10. This conversion may include signal demodulation and down-conversion. The RF signal processing circuit 20 may be formed of a radio frequency integrated circuit (RFIC).

The frontend circuit 30 includes a PA (power amplifier) module 31, an LNA (low noise amplifier) module 32, diplexers 33 and 34, and a duplexer 35. As the PA module 31, any of the radio frequency modules 100a to 100d described in the first to fourth embodiments is used. That is, a ground conductor in an internal layer of a multilayer substrate that constitutes the PA module 31 is physically separated into a ground conductor that is used in an amplifying circuit including a power amplifier and a ground conductor that is used in a power supply circuit (including a bias circuit) supplying power to the power amplifier. The frontend circuit 30 may be formed of a single radio frequency module as a whole.

The PA module 31 amplifies a multiband transmission RF signal Tx received from the RF signal processing circuit 20 and outputs transmission RF signals Tx1 and Tx2 in respective frequency bands. The diplexer 33 combines the transmission RF signals Tx1 and Tx2 and supplies the combined signal to the duplexer 35.

The duplexer 35 mixes a transmission RF signal received from the diplexer 33 with an antenna signal ANT, and separates a reception RF signal from an antenna signal ANT and supplies the reception RF signal to the diplexer 34. The antenna signal ANT is transmitted and received by an antenna 2. The antenna 2 may be included in the communication device 1.

The diplexer 34 separates a reception RF signal separated by the duplexer 35 into reception RF signals Rx1 and Rx2 in respective frequency bands. The LNA module 32 amplifies the reception RF signals Rx1 and Rx2 and supplies a multiband reception RF signal Rx obtained as a result of amplification to the RF signal processing circuit 20.

In the communication device 1, the radio frequency module that can prevent leakage of a signal from the amplifying circuit to the power supply circuit with a higher degree of certainty is used as the PA module 31. Therefore, a high-performance communication device can be obtained.

As in the PA module 31, any of the radio frequency modules 100a to 100d described in the first to fourth embodiments may be applied to the LNA module 32. That is, a ground conductor in an internal layer of a multilayer substrate that constitutes the LNA module 32 may be physically separated into a ground conductor that is used in an amplifying circuit including a low noise amplifier and a ground conductor that is used in a power supply circuit (including a bias circuit) supplying power to the low noise amplifier.

Although the radio frequency modules and the communication device according to the embodiments of the present disclosure have been described, the present disclosure is not limited to the embodiments. Various modifications conceived by a person skilled in the art and made to the embodiments or a form configured by combining constituent elements in different embodiments without necessarily departing from the spirit of the present disclosure may be within the scope of one or more aspects of the present disclosure.

INDUSTRIAL APPLICABILITY

The present disclosure can be widely used in various communication devices as a radio frequency module.

REFERENCE SIGNS LIST 1 communication device
2 antenna
10 baseband signal processing circuit
20 RF signal processing circuit
30 frontend circuit
31, 900 PA (power amplifier) module
32 LNA (low noise amplifier) module
33, 34 diplexer
35 duplexer
100, 100a, 100b, 100c, 100d radio frequency module
110 amplifying circuit
111 amplifying element
112 input matching circuit
113 output matching circuit
120 power supply circuit
121 first power supply circuit
122 second power supply circuit
210, 220 region
211, 212, 213, 221, 222 portion of region
310, 311, 312, 313, 320, 321, 322 ground conductor
412, 413, 414, 421, 422 wiring conductor
510, 511, 512, 513, 520, 521, 522 via conductor
600 multilayer substrate
601 to 606 insulator layer

The invention claimed is:
1. A radio frequency module comprising:
a multilayer substrate that includes a plurality of insulator layers;
an amplifying circuit that is provided on the multilayer substrate and amplifies a radio frequency signal;
a power supply circuit that is provided on the multilayer substrate and supplies power to the amplifying circuit;
a first conductor pattern that has a ground potential and is used in the amplifying circuit; and
a second conductor pattern that has a ground potential and is used in the power supply circuit, wherein
the first conductor pattern and the second conductor pattern are physically separated from each other and provided in internal layers of the multilayer substrate, wherein the amplifying circuit includes a first amplifying element and a second amplifying element, the power supply circuit includes a first power supply circuit that is connected to the first amplifying element and a second power supply circuit that is connected to the second amplifying element, and the second conductor pattern is physically separated into a third portion that has a ground potential and is used in the first power supply circuit and a fourth portion that has a ground potential and is used in the second power supply circuit.

2. The radio frequency module according to claim 1, wherein the first conductor pattern and the second conductor pattern are provided in a same internal layer of the multilayer substrate.

3. The radio frequency module according to claim 2, wherein the amplifying circuit includes an input matching circuit that is connected to an input end of the first amplifying element, and an output matching circuit that is connected to an output end of the first amplifying element, and the first conductor pattern is physically separated into a first portion that has a ground potential and is used in the input matching circuit and a second portion that has a ground potential and is used in the output matching circuit.

4. The radio frequency module according to claim 2, wherein in a peripheral portion of at least one conductor pattern among the first conductor pattern and the second conductor pattern, a plurality of via conductors that are electrically connected to the at least one conductor pattern and extend in a laminating direction of the multilayer substrate are provided.

5. A communication device comprising:

the radio frequency module according to claim 2; and an RF signal processing circuit that is connected to the radio frequency module.

6. The radio frequency module according to claim 1, wherein the amplifying circuit includes an input matching circuit that is connected to an input end of the first amplifying element, and an output matching circuit that is connected to an output end of the first amplifying element, and the first conductor pattern is physically separated into a first portion that has a ground potential and is used in the input matching circuit and a second portion that has a ground potential and is used in the output matching circuit.

7. The radio frequency module according to claim 6, wherein in a peripheral portion of at least one conductor pattern among the first conductor pattern and the second conductor pattern, a plurality of via conductors that are electrically connected to the at least one conductor pattern and extend in a laminating direction of the multilayer substrate are provided.

8. A communication device comprising:

the radio frequency module according to claim 6; and an RF signal processing circuit that is connected to the radio frequency module.

9. The radio frequency module according to claim 1, wherein in a peripheral portion of at least one conductor pattern among the first conductor pattern and the second conductor pattern, a plurality of via conductors that are electrically connected to the at least one conductor pattern and extend in a laminating direction of the multilayer substrate are provided.

10. A communication device comprising:

the radio frequency module according to claim 9; and an RF signal processing circuit that is connected to the radio frequency module.

11. A communication device comprising:

the radio frequency module according to claim 1; and an RF signal processing circuit that is connected to the radio frequency module.

* * * * *